United States Patent
Habara et al.

(10) Patent No.: US 7,372,272 B2
(45) Date of Patent: May 13, 2008

(54) ELECTROMAGNETIC WAVE TRANSCEIVER APPARATUS AND NUCLEAR MAGNETIC RESONANCE ANALYZING APPARATUS USING IT

(75) Inventors: Hideta Habara, Kokubunji (JP); Minseok Park, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 243 days.

(21) Appl. No.: 11/206,273

(22) Filed: Aug. 18, 2005

(65) Prior Publication Data
US 2006/0049825 A1 Mar. 9, 2006

(30) Foreign Application Priority Data
Sep. 8, 2004 (JP) .............................. 2004-260685
Oct. 21, 2004 (JP) .............................. 2004-306499

(51) Int. Cl.
*G01V 3/00* (2006.01)
(52) U.S. Cl. ..................................................... 324/318
(58) Field of Classification Search ......... 324/300–322
See application file for complete search history.

(56) References Cited

FOREIGN PATENT DOCUMENTS

JP 2004-4089 1/2004

*Primary Examiner*—Brij Shrivastav
*Assistant Examiner*—Dixomara Vargas
(74) *Attorney, Agent, or Firm*—Antonelli, Terry, Stout & Kraus, LLP.

(57) ABSTRACT

An electromagnetic transceiver apparatus for a NMR apparatus has an intermediate frequency generator for preparing an intermediate wave, a transmission frequency converter for preparing, on the basis of an intermediate frequency of the intermediate wave, an electromagnetic wave to be radiated from a transmitter coil, a reception frequency converter for processing a signal received by the NMR probe, an analog-digital converter for converting an output of the reception frequency converter into a digital signal, an IQ detector for performing detection on the basis of an output of the analog-digital converter, a phase locked loop and a switch inserted between the analog-digital converter and the reception frequency converter to select either an input from the intermediate frequency generator or an input from the reception frequency converter.

10 Claims, 8 Drawing Sheets

ELECTROMAGNETIC WAVE TRANSCEIVER APPARATUS AND NUCLEAR MAGNETIC RESONANCE ANALYZING APPARATUS USING IT

BACKGOUND OF THE INVENTION

The present invention relates to an electromagnetic wave transceiver apparatus and a nuclear magnetic resonance analyzing apparatus (hereinafter referred to as "NMR" apparatus) using it.

In the NMR apparatus, an electromagnetic wave such as a radio wave or microwave having a period of about several nanoseconds is radiated to a sample placed in a static magnetic field and a free induction decay signal generated from the sample on the basis of or under the influence of the electromagnetic wave is received to analyze the sample. Recently, the NMR apparatus has been expected to be used especially for specifying composition and structure of, for example, protein.

Generally, the NMR apparatus has a magnet unit for generating a static magnetic field, a transmitter coil arranged around a sample to radiate an electromagnetic wave to the sample, a transmitter for generating and transmitting the electromagnetic wave to be radiated from the transmitter coil to the sample, a receiver coil arranged around the sample to receive a free induction decay signal from the sample, and a receiver for processing the fee induction decay signal received by the receiver coil. A local oscillator belonging to both the transmitter and the receiver is also provided and it is also general to provide a transceiver apparatus incorporating both of transmitter function and receiver function.

Further, in recent years, digital technologies have been introduced to the transmitter and receiver of the NMR apparatus. Especially, a digital technology in a low frequency range of about 10 MHz has been realized, making it possible to prepare and process a digital signal of an electromagnetic wave at several of tens of MHz to several of hundreds of MHz on a circuit board. Processing based on digital signals (hereinafter referred to as "digital processing") is advantageous in that a signal delay due to a difference in wiring length on the board and a frequency or phase shift due to temperature-change dependent differences in characteristics of circuit constituent elements such as capacitors and inductors can be suppressed to assure more accurate measurement.

Of digital processing, a method for processing a free induction decay signal from a sample is called a digital detection method and this method has many advantages of (1) reducing the spurious noise and frequency error, (2) broadening the dynamic range, (3) increasing the S/N ratio, (4) reducing the irregularities in performance of individual products and (5) simplifying the maintenance and the portion subject to circuit adjustment.

In connection with the digital processing, JP-A-2004-4089 describes digital processing in a transmitter and U.S. Pat. No. 6,259,253 specification describes digital processing in a receiver.

Even in a NMR apparatus adopting the digital processing as above, however, employment of digital processing covering a high-frequency portion in the transmitter, for example, is very difficult to achieve at present and analog processing must be used in part. But in the apparatus having coexistent analog processing and digital processing portions or circuitries, synchronization of phase must be set up between an analog oscillator and a digital oscillator. Conventionally, a phase locked loop circuit is provided for establishment of the phase synchronization.

On the other hand, in digital processing for use in the NMR apparatus, a unit called a digital direct synthesizer (DDS), which is adapted to output a digital numerical value in synchronism with a clock, exhibits excellent performance in controlling change in frequency and in phase controlling and therefore has been used in NMR spectrometers.

In the NMR spectrometer, the function to transmit a signal at a frequency and with a phase, subsequently transmit a signal at a lightly deviated frequency and then transmit a signal at the original frequency and with the original phase is sometimes needed. For example, a spectrum of a 13C carbon nucleus has a wide range up to 120 ppm and hence, for the sake of uniform excitation of the overall spectral region, a transmission radio wave pulse is switched by about 20 kHz and is then radiated.

Generally, when the frequency is changed using the DDS and again returned to the original frequency, phase information involved is often lost. This will be caused by temporal uncertainty and error which take place when the frequency is changed and an error in phase offset calculation carried out when the frequency is returned to the original value. To solve this problem, a conventional radio wave transmitter circuit for NMR is mounted with two or more DDS's.

The radio wave transmitter circuit for NMR can function pursuant to a method, called composite pulse decoupling, for changing the phase intermittently several of thousands times by using a DDS and exciting frequencies of wide band by using a single transmission frequency. In addition, a method for shaped pulse is also available in which amplitude and phase of a transmission wave is changed to a Gauss type waveform or a sine waveform to thereby excite only a narrow band.

For generation of the pulse as above, two or more DDS's are used in combination. A DDS used for digital processing in a transmitter is described in JP-A-2004-4089.

SUMMARY OF THE INVENTION

In a NMR apparatus adopting the digital processing as above, however, the phase locked loop circuitry faces a problem that the circuit constant drifts and electrical noises take place suddenly under the influence of temperatures, making it difficult to keep the phase coincident over several hours between a circuitry for analog processing (hereinafter referred to as an "analog circuitry") and a circuitry for digital processing (hereinafter referred to as a "digital circuitry"). For example, an intermediate frequency generator representing an analog circuitry of the transmitter is made to be synchronous with a reference clock generator in digital detector representing a digital circuitry of the receiver through the medium of the phase locked loop circuitry but a phase shift of about several degrees per hour takes place between the analog and digital circuitries. The occurrence of the phase shift is attributable to differences in thermal coefficients and in characteristics of power amplifiers, bandpass filters and attenuators.

On the other hand, for correction of the phase shift, measures can tentatively be taken in which transmitter and receiver systems of a radio wave are connected directly to each other by a cable during consignment of a product of apparatus or at the time that maintenance of the apparatus is conducted every several months so that a correction program may tentatively be executed to adjust shifts in phase and amplitude.

Recently, however, measuring time for measurement of protein with a NMR apparatus (hereinafter referred to as "NMR measurement") tends to be prolonged and keeps continuing up to an extremity of several weeks. Accordingly, measurement errors due to shifts in phase and amplitude during measurement cannot be suppressed sufficiently by the maintenance conducted at the aforementioned intervals. Especially, coping with a phase shift attributable to a sudden electrical noise is very difficult to achieve.

Even in the NMR apparatus adopting the DDS in the digital processing as described above, temporally accurate control is necessary for creating, for example, a waveform for frequency sweep called a chirp waveform. The chirp waveform has an advantage that frequencies in broader band than those by the aforementioned composite pulse can be excited with less power.

In order to modulate frequency and phase by using the DDS, there needs an operation for accessing frequency and phase registers of the DDS at high speeds to rewrite their values. Typically, time required for change of the phase and frequency of the DDS operating at 80 MHz is normally 100 to 300 nanoseconds. This time period is not sufficiently short to create such a waveform as the aforementioned chirp waveform in which the frequency changes continuously. The method of changing the frequency and phase registers of the DDS in synchronism with an accurate clock has a disadvantage that the output wave can take only combinations of sine waveforms.

Further, for the purpose of incorporating two or more DDS's in a NMR transmitter to form a circuit for changing the frequency and phase of the DDS, a technique such as an application specific integrated circuit (ASIC) is needed and general-purpose and low-cost IC's for constituting a general DDS cannot be used. As a result, the costs of development increase disadvantageously.

An object of this invention is to provide a NMR apparatus capable of eliminating the aforementioned problems encountered in the prior arts and a radio wave transceiver apparatus used for the NMR apparatus.

Another object of the invention is to provide a NMR apparatus having high measurement accuracy by sufficiently suppressing a phase shift occurring during measurement between a digital circuitry and an analog circuitry and a radio wave transceiver apparatus for use in the NMR apparatus.

Still another object of the invention is to provide an electromagnetic wave transmitter which can eliminate the aforementioned conventional problems by realizing frequency and phase modulation at faster rates and improving the degree of freedom of modulation drastically and a NMR apparatus having excellent packaging performance in the light of production cost.

To accomplish the above objects, the present invention adopts typical measures as below.

More particularly, as first measures, the following means is adopted.

Namely, in a NMR apparatus comprising a magnet unit for generating a static magnetic field, a NMR probe having a transmitter coil for radiating an electromagnetic wave to a sample inserted in the magnet unit and a receiver coil for detecting a signal generated from the sample and an electromagnetic wave transceiver apparatus electrically connectable to either the transmitter coil or the receiver coil in the NMR probe, the electromagnetic wave transceiver apparatus includes:

an intermediate frequency generator for preparing an intermediate wave;

a transmission frequency converter for preparing, on the basis of an intermediate frequency of the intermediate wave, an electromagnetic wave to be radiated from the transmitter coil;

a reception frequency converter for processing a signal received by the NMR probe; an analog-digital converter for converting an output of the reception frequency converter into a digital signal;

an IQ (in-phase & quadrature-phase) detector for performing detection on the basis of an output of the analog-digital converter to output a detection signal;

a phase locked loop for synchronizing a clock frequency for the analog-digital converter with the frequency from the intermediate frequency generator; and a switch interposed between the analog-digital converter and the reception frequency converter to select either an input from the intermediate frequency generator or an input from the reception frequency converter.

As second measures, the following means is adopted.

Namely, in a NMR apparatus comprising a magnetic unit for generating a static magnetic field, a NMR probe having a transmitter coil for radiating an electromagnetic wave to a sample inserted in the magnetic unit and a receiver coil for detecting a signal generated from the sample and an electromagnetic wave transceiver apparatus electrically connectable to either the transmitter coil or the receiver coil in the NMR probe, the electromagnetic wave transceiver apparatus includes:

an intermediate frequency generator for preparing an intermediate wave;

a transmission frequency converter for preparing, on the basis of an intermediate frequency of the intermediate wave, an electromagnetic wave to be radiated from the transmitter coil;

a reception frequency converter for processing a signal received by the NMR probe;

an analog-digital converter for converting an output of the reception frequency converter into a digital signal;

an IQ (in-phase & quadrature-phase) detector for performing detection on the basis of an output of the analog-digital converter to output a detection signal;

a phase locked loop for synchronizing a clock frequency for the analog-digital converter with the frequency from the intermediate frequency generator;

a first switch (207A) interposed between the transmission frequency converter and the transmitter coil in the NMR probe;

a second switch (207B) interposed between the receiver coil in the NMR probe and the reception frequency converter; and a wiring line for directly connecting the first and second switches, wherein the first switch delivers an output from the transmission frequency converter to either the transmitter coil or the wiring line and the second switch switches an input from the receiver coil and an input from the wiring line to deliver either input to the reception frequency converter.

As third measures, the following means is adopted.

Namely, a transceiver apparatus for NMR apparatus includes:

an intermediate frequency generator for preparing an intermediate wave;

a transmission frequency converter for preparing, on the basis of an intermediate frequency of the intermediate wave, an electromagnetic wave to be radiated from the transmitter coil;

a reception frequency converter for processing a signal received by the NMR probe;

an analog-digital converter for converting an output of the reception frequency converter into a digital signal;

an IQ (in-phase & quadrature-phase) detector for performing detection on the basis of an output of the analog-digital converter;

a phase locked loop for synchronizing a clock frequency for the analog-digital converter with the frequency from the intermediate frequency generator; and a switch interposed between the analog-digital converter and the reception frequency converter to select either an input from the intermediate frequency generator or an input from the reception frequency converter.

Preferably, in any of the-first to third measures, the electromagnetic wave transceiver apparatus further includes:

a phase/amplitude calculator for receiving the detection signal from the IQ detector to determine a phase correction value; and an IQ phase corrector for storing the phase correction value from the phase/amplitude calculator, wherein the IQ phase corrector corrects the detection signal from the IQ detector with the phase correction value and outputs the corrected detection signal as a detection signal from the electromagnetic wave transceiver.

More preferably, in a relaxation time, the switch connects the output of the intermediate frequency generator to the input of the analog-digital converter in place of the output of the reception frequency converter and in the relaxation time, the phase/amplitude calculator determines the phase correction value to store it in the IQ phase corrector.

By adopting any of the first to third measures, the present invention can provide a NMR apparatus having high measurement accuracy by sufficiently suppressing a shift in phase taking place between the digital circuitry and the analog circuitry and can provide a radio wave transceiver apparatus for the NMR apparatus.

To accomplish still another object, the following fourth and fifth measures are adopted.

More particularly, an electromagnetic wave transmitter for supplying an electromagnetic wave to a NMR apparatus includes:

a controller for controlling modulation of phase or frequency;

a numerical controlled oscillator for receiving a digital numerical value from the controller to periodically oscillate a saw-tooth wave at a constant frequency;

a memory for storing information of modulation of phase or frequency from the controller;

an adder for adding an output from the numerical controlled oscillator and the modulation information stored in the memory;

a converter for converting digital data from the adder into an amplitude of sine waveform; and a D/A converter for converting amplitude modulation data from the converter into an analog waveform.

In the electromagnetic transmitter as above, the phase modulation can be carried out by accumulating waveform data of a predetermined value in the memory. for a predetermined period. Alternatively, the frequency modulation can be carried out by accumulating saw-tooth waveform data in the memory for a predetermined period.

In the electromagnetic wave transmitter as above, an operating clock for the numerical controlled oscillator, an adding clock for the adder and a data reading clock for the memory are made to be coincident with each other. This permits the frequency or phase modulation to be done at a high speed.

Further, by stopping the addition function of the adder during operation or making the modulation information of the memory zero and causing the adder to add it, the frequency or phase modulation can be stopped during operation.

Further, in a NMR apparatus according to the invention comprising a magnet unit for generating a static magnetic field, a NMR probe having a transmitter coil for radiating an electromagnetic wave to a sample inserted in the magnet unit and a receiver coil for detecting a signal generated from the sample and an electromagnetic wave transmitter and an electromagnetic wave receiver electrically connectable to the transmitter coil and the receiver coil in the NMR probe, respectively, an electromagnetic wave transmitter of the present invention is used as the electromagnetic wave transmitter.

According to the electromagnetic wave transmitter of the invention, as compared to the conventional one, frequency and phase modulation can be realized at higher speeds and the degree of freedom of modulation can be improved drastically to advantage.

The NMR apparatus of the invention uses the electromagnetic transmitter incorporating a single DDS and therefore the production costs can be reduced to attain the effect of excellent packaging performance.

Other objects, features and advantages of the invention will become apparent from the following description of the embodiments of the invention taken in conjunction with the accompanying drawings.

DETAILED DESCRIPTION OF THE EMBODIMENTS

Embodiments of the present invention will now be described with reference to the accompanying drawings. It should be understood that the present invention can be changed and modified in various ways by utilizing technical ideas disclosed in the form of the embodiments and is in no way limited restrictedly to the embodiments described in the present specification.

Figure 1A:
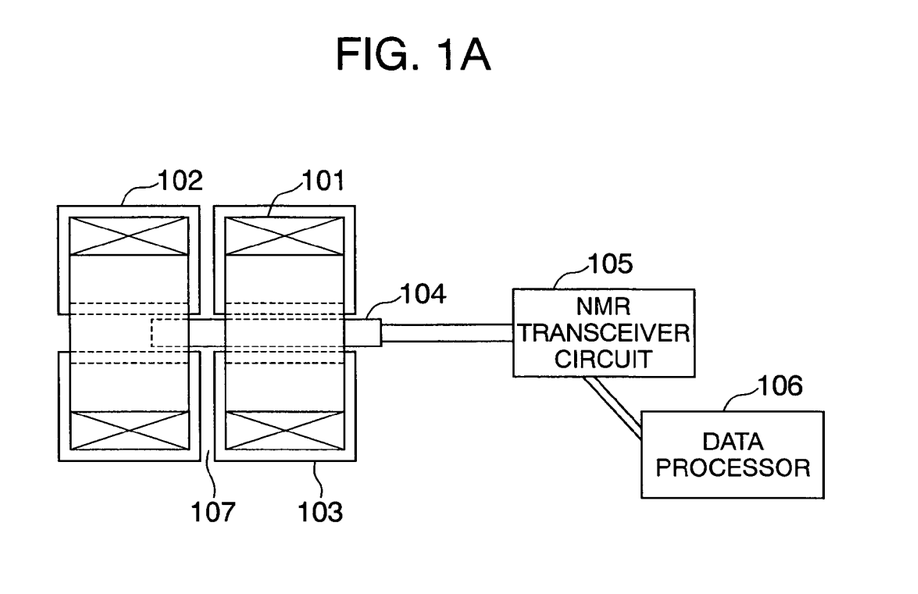
FIG. 1A is a sectional view, as seen from the side of an example of a NMR apparatus to which the invention is applied, useful to explain the outline of the NMR apparatus.
Figure 1B:
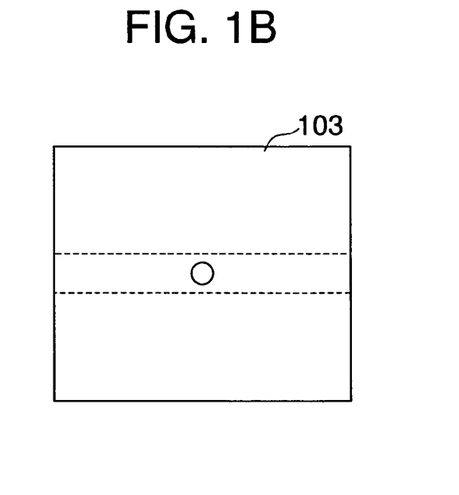
FIG. 1B is a plan view showing a magnet unit in FIG. 1A, as viewed from the top.
Figure 1C:
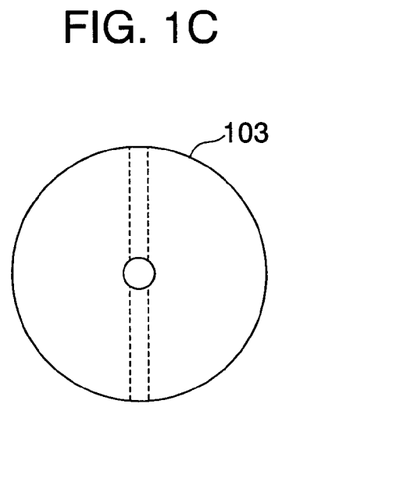
FIG. 1C is a plan view showing the magnet unit in FIG. 1A, as viewed in the direction of probe insertion.

Referring to FIG. 1A, a NMR apparatus to which the invention is applied is illustrated in sectional form as viewed from the side thereof to show the outline of the apparatus. A magnet unit in FIG. 1A is illustrated in FIG. 1B in plan view form as viewed from top and is illustrated in FIG. 1C in plan view form as viewed in the direction of probe insertion.

The NMR apparatus according to the invention comprises a magnet unit 103 provided with a low-temperature vessel 102 for housing a superconducting magnet 101 adapted to apply a static magnetic field to a sample, a NMR probe 104 being insertional to the superconducting magnet unit and having a transmitter coil for transmitting an electromagnetic wave such as radio wave to the sample and a receiver coil for receiving a free induction decay signal generated from the sample, a NMR transceiver apparatus 105 connected to the NMR probe 104 to prepare and transmit the electromagnetic wave to be radiated from the transmitter coil and conduct a signal process on the basis of the free induction decay signal from the receiver coil, and a data processor 106 connected to the NMR transceiver apparatus to perform various kinds of data processing in accordance with outputs of the transceiver apparatus.

The magnet unit 103 has the low-temperature vessel 102 and the superconducting magnet 101 arranged inside the vessel. A coolant such as liquid nitrogen or liquid helium is injected to the low-temperature vessel 102 so as to cool the superconducting magnet 101. The superconducting magnet 101 has superconducting coils arranged in pair, having a winding axis in the horizontal direction, and an intervening space between the paired superconducting coils forms a sample insertion space 107 in which the sample is inserted or placed. The sample is inserted from above the sample insertion space. Each of the superconducting coils constituting the superconducting magnet 101 is illustrated in the form of a single layer magnet for simplicity of explanation. However, when a multi-layer superconducting coil is used, adjustment is needed between individual superconducting coils but uniformity of a magnetic field can be improved to advantage. A space having its cavity along the horizontal winding axis of the superconducting coil is formed and the low-temperature vessel 102 has cavities formed in correspondence with the space. The NMR probe 104 is inserted along the space cavities of the superconducting coil and low-temperature vessel. Though not shown in FIG. 1A, the NMR probe 104 adopts a coil having a vertical sample space for permitting the sample to be inserted vertically. The transmitter coil is of a barrel type and the receiver coil is of a solenoid type. These coils are made of a superconducting material to improve their sensitivity and a cooling structure for cooling the coils is arranged inside the NMR probe.

With the NMR apparatus according to the invention constructed as above, an electromagnetic wave having a period of about several microseconds is radiated to a sample placed in a static magnetic field and a free induction decay signal generated from the sample under the influence of the electromagnetic wave is received and processed to conduct NMR measurement.

Embodiment 1

Figure 2:
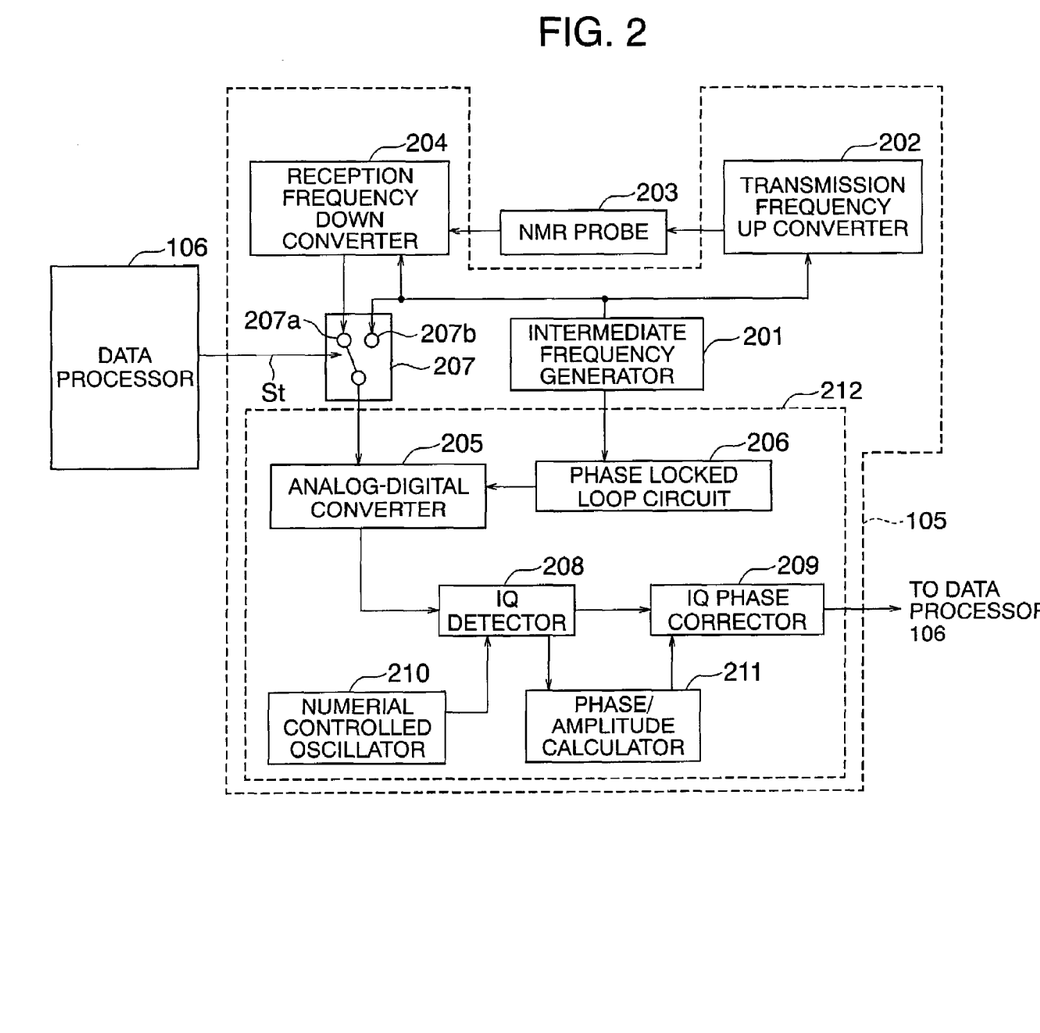
FIG. 2 is a block diagram showing the outline of a NMR transceiver circuit according to a first embodiment of the invention.

Making also reference to a block diagram of FIG. 2, the construction of NMR transceiver circuit 105, inclusive of peripheral components, according to a first embodiment of the invention will now be described. The NMR transceiver circuit according to the present embodiment includes an intermediate frequency generator 201 for generating an intermediate wave, a transmission frequency converter (for example, a frequency up converter) 202 for preparing, on the basis of an intermediate frequency of the intermediate wave prepared by the intermediate frequency generator, an electromagnetic wave to be transmitted to a sample, a reception frequency converter (for example, a frequency down converter) 204 for processing a free induction decay signal (hereinafter referred to as "FID signal") a receiver coil in a NMR probe 203 has received as a result of transmission of the electromagnetic wave to the NMR probe 203, an analog-digital converter 205 (hereinafter referred to as "A/D converter") 205 for converting the analog FID signal received by the NMR probe 203 into a digital FID signal and a phase locked loop circuit 206. Additionally structurally, a switch 207 for switching an input from the reception frequency down converter 204 and an input from the intermediate frequency generator is interposed between the reception frequency down converter 204 and the A/D converter 205, an IQ (in-phase & quadrature-phase) detector 208 is connected to the A/D converter 205 and an IQ corrector 209 is connected to the IQ detector 208. Connected to the IQ detector 208 is a numerical controlled oscillator 210 and connected to the IQ phase corrector 209 is a phase/amplitude calculator 211. In the present embodiment, the A/D converter 205, IQ detector 208, numerical controlled oscillator 210, phase/amplitude calculator 211 and IQ phase corrector 209 are included in a digital processing circuitry (hereinafter this circuitry will be called a "digital detector 212"). The numerical controlled oscillator (NCO) is an integrated circuit for delivering numerical values as digital data in synchronism with a clock at a predetermined rate and can operate to control frequency and phase with higher accuracy as compared to the analog oscillator. The clocks for the numerical controlled oscillator 210 and A/D converter 205 are required to be synchronized with a clock for the intermediate frequency generator 201. Therefore, the phase locked loop circuit 206 generates a synchronized clock stably by consulting the frequency of the intermediate frequency generator to supply the thus synchronized clock to the A/D converter 205 and NCO 210. Through this, the frequency relation throughout the whole of the electromagnetic wave transceiver apparatus can be made to be stable.

Generally, the NMR measurement is carried out by repeating a series of procedures of transmission of a radio wave pulse to the transmitter coil from the radio wave transceiver apparatus, radiation of the radio wave to a sample from the transmitter coil, reception of a FID signal from the sample and relaxation of the sample. In the case of a sample of liquid, the pulse transmission time is, in general, about 0.1 second, the reception time of the FID signal is about 0.5 seconds and the sample relaxation time is about 1 second and in a long NMR measurement operation, the above procedures are sometimes conducted reiteratively for about a week.

Procedures of the NMR measurement using the NMR apparatus according to the present embodiment will specifically be described with reference to FIG. 2. Firstly, the transmission frequency up converter 202 consults the intermediate frequency of the intermediate frequency generator 201 to prepare an electromagnetic wave at a frequency of several of hundreds of MHz and transmits it to the transmitter coil of the NMR probe 203. The electromagnetic wave is radiated to a sample by means of the transmitter coil and the receiver coil receives a FID signal generated from the sample. The reception frequency down converter 204 consults the intermediate frequency of the intermediate frequency generator 201 to prepare an electromagnetic wave at a frequency of several of hundreds of MHz and uses it to down convert the received FID signal which in turn is inputted to the A/D converter 205 via the switch 207 so as to be converted into a digital FID signal. When receiving the FID signal from the sample in this phase of measurement, a switch 207 (e.g., an electric switch) is connected to a terminal 207a side to electrically connect the A/D converter 205 and the reception down converter 204. On the other hand, while the sample takes its relaxation time, the switch 207 is connected to a terminal 207b side to electrically connect the intermediate frequency generator 201 and the A/D converter 205. The switching operation of switch 207 as above is executed with a timing command St fed from the data processor 106 to the switch 207.

With the above construction, phase correction can be made by utilizing the relaxation time of the sample highly efficiently and without consuming unnecessarily long time. The relaxation time is necessary for orienting a nuclear spin of the sample in random directions, thereby once resetting information the sample has so as to make ready for new measurement and it can be used efficiently. The switch 207 can suppress noises due to irregularities in sampling clock inside the A/D converter and is therefore conducive to highly accurate NMR measurement. The switch 207 is required of characteristics as below.

The switch used herein is required to suffer from addition of less noise when connecting the reception frequency down converter 204 and the A/D converter 205 and to sufficiently exclude leakage of signal from the intermediate frequency generator 201. This is because, in the event that even a slight amount of signals leaks from the intermediate frequency generator 201, the leakage signals mix with a true signal from the sample and intrude as noise into a reception spectrum. Generally, the dynamic range of the A/D converter 205 is about 80 dB and therefore, isolation (separation degree) of the switch 207 is also desired to be 80 dB or more. The so-called high-frequency switch is sorted into the type using a mechanical relay and the type using a semiconductor diode. The former type has a slow switching speed of several milliseconds but has good isolation amounting to 60 dB to 80 dB. The latter type has a high switching speed of several microseconds but has insufficient isolation amounting to about 40 dB. Since the relaxation time of samples used in the NMR is, in general, about 1 second or more and conceivably the mechanical switch suffices for use in this application. It is however necessary that the frequency band usable by the switch be sufficiently coincident with the intermediate frequency.

For driving the switch, the timing command St is fed to the switch 207 from the data processor 106 which controls operation of the whole of the electromagnetic wave transceiver apparatus in order that during relaxation time of the sample, the switch 207 is steadily transferred to the terminal 207b.

Figure 3:
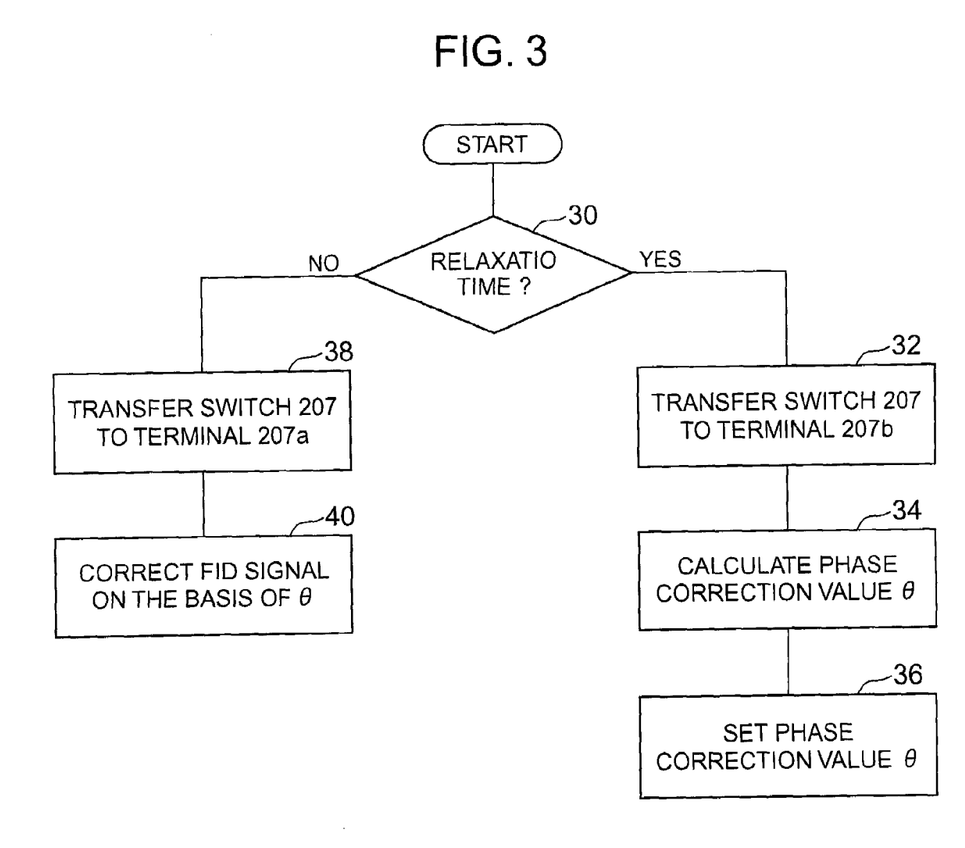
FIG. 3 is a flowchart for explaining operation of the NMR transceiver circuit in the first embodiment.

The phase correction operation will be described by making reference to a flowchart of FIG. 3 useful to explain operation in the NMR transceiver circuit according to the present embodiment. This operation is carried out under the control of the data processor 106.

Firstly, as described previously, when a relaxation time is determined (step 30), the switch 207 is transferred to the terminal 207b (step 32) and the intermediate frequency generator 201 and the A/D converter 205 are connected through the switch 207. As a result, an intermediate frequency signal having high purity of frequency is inputted to the IQ detector 208 from the intermediate frequency generator 201. The IQ detector 208 delivers a resulting detection signal to the phase/amplitude calculator 211. It will be appreciated that since the highly purified signal is inputted to the IQ detector, the resulting detection signal is a DC signal. In other words, the IQ detector 208 performs detection for converting the intermediate frequency signal into the DC signal.

Then, the phase/amplitude calculator 211 calculates an amplitude correction value and a phase correction value (step 34). To explain more specifically, where an in-phase signal and a quadrature-phase signal of the signal detected by the IQ detector 208 are I and Q, respectively, the phase/amplitude calculator 211 uses time averages $I_0$ and $Q_0$ of the I and Q signals to determine an amplitude correction value as $\sqrt{(I_0 \times I_0 + Q_0 \times Q_0)}$ and a phase correction value $\theta$ as $90 \times \text{sign}(I_0) \times (1 - \text{sign}(Q_0)) + \tan^{-1}(I_0/Q_0)$. The function sign (x) is a function taking 1 when x is positive numbers and −1 when x is negative numbers.

The phase/amplitude calculator 211 outputs its calculation value to the IQ phase corrector 209 and the phase corrector 209 holds the calculation value as a phase correction value $\theta$ (step 36).

On the other hand, when not relaxation time but measurement time is determined (step 30), the switch 207 is transferred to the terminal 207a (step 38) and the reception frequency down converter 204 and A/D converter 205 are connected through the switch 207. Consequently, an FID signal generated from the sample as a result of measurement is converted into a digital FID signal by means of the A/D converter 205 and inputted to the IQ detector 207 as described previously. The IQ detector 207 detects an in-phase signal (hereinafter termed "I(t)") and a quadrature-phase signal (hereinafter termed "Q(t)") of the digital FID and delivers a detected signal to the IQ phase corrector 209. On the basis of the correction phase value $\theta$ saved precedently in the above process, the IQ phase corrector 209 corrects the detected digital FID signal delivered out of the IQ detector pursuant to the following equation (step 40). Preferably, this correction operation can be completed in a short time period of several milliseconds.

$$I'(t) = \cos(\theta) \times I(t) + \sin(\theta) \times Q(t) \quad (1)$$

$$Q'(t) = -\sin(\theta) \times I(t) + \cos(\theta) \times Q(t) \quad (2)$$

As a result, I'(t) and Q'(t) are added with phase corrections and even in the event that a phase shift takes place between the digital circuitry and the analog circuitry during measurement, the shift can be suppressed sufficiently. It is to be noted that high speed operation of the phase/amplitude calculator and IQ phase corrector can preferably be materialized with an incorporated semiconductor circuit such as free programming gate arrays, an application specific integrated circuit or a digital signal processor integrated circuit.

As described above, by using the electromagnetic wave transceiver circuit according to the present embodiment, a NMR apparatus having high measurement accuracy can be constructed.

For the purpose of realizing the function of the IQ phase corrector in the present embodiment, it is conceivable to employ a method for correcting phase and amplitude of the numerical controlled oscillator in the figure. Normally, however, the operating clock for the numerical controlled oscillator is fast amounting up to about 50 MHz and is comparable to the sampling clock for the A/D converter. In other words, when the intermediate frequency used for IQ detection is 10 to 20 MHz, the numerical controlled oscillator oscillates at a numerical value which is only about 2.5 to 5 points per period and for the sake of improving the effect of correction, it is necessary to contrive reduction of the intermediate frequency to several MHz and the use of 16 bits of output bit number of the NCO in place of the normal, approximate 12 bits.

The superconducting magnet having the winding axis in the horizontal direction is used for the superconducting magnet unit in the NMR apparatus according to the present embodiment but as far as the electromagnetic wave transceiver apparatus according to the present embodiment is used, it can be applicable to another type of NMR apparatus (for example, a vertical type in which the winding axis is vertical relative to the ground, or a gradient type in which the winding axis is slanted relative to the ground).

Embodiment 2

Figure 4:
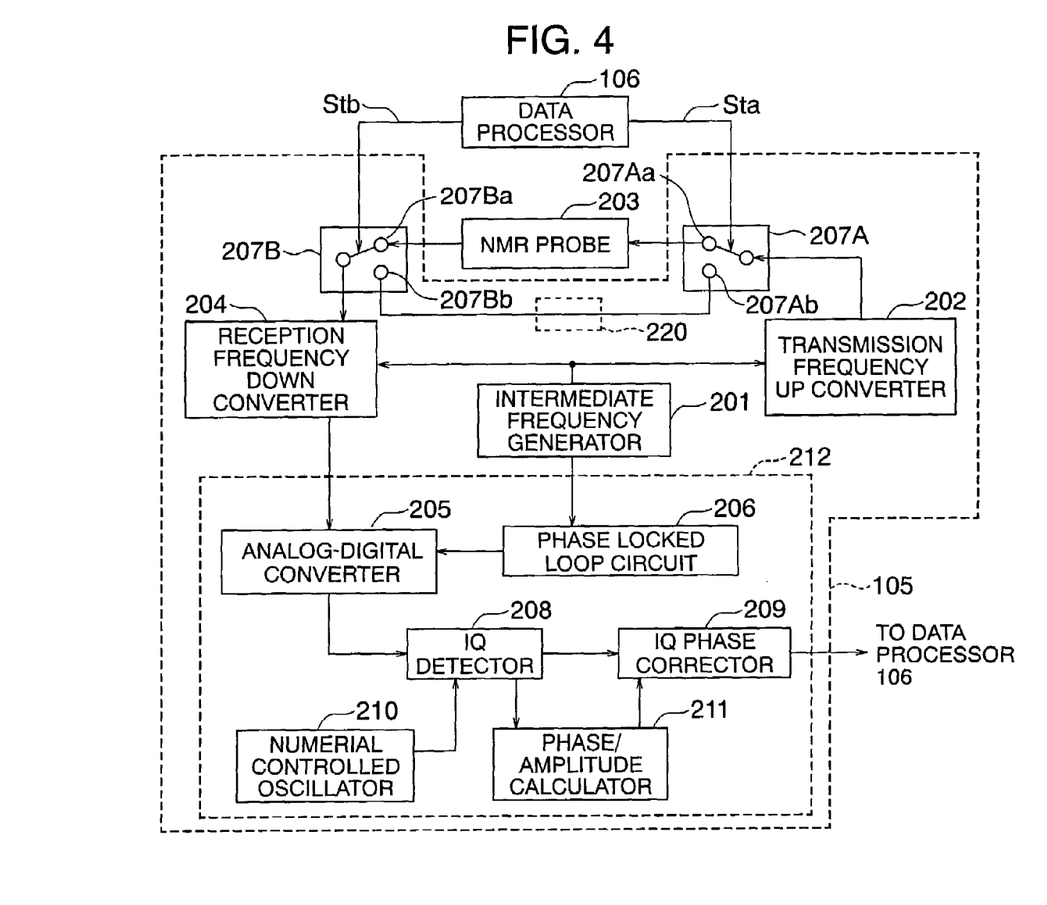
FIG. 4 is a block diagram showing the outline of a NMR transceiver circuit according to a second embodiment of the invention.

Turning now to FIG. 4, a second embodiment of the present invention will be described. The present embodiment is substantially the same as embodiment 1 with the only exception that switches are positioned differently and the construction of the remaining parts differs correspondingly.

In a NMR apparatus according to the present embodiment, a switch 207A is interposed between a transmission frequency up converter 202 and a NMR probe 203 and a switch 207B is interposed between a reception frequency down converter 204 and the NMR probe 203, so that the NMR probe can be on a roundabout route by providing a wiring line between these switches. The switches 207a and 207b can be controlled by timing commands sta and stb, respectively, from the data processor 106.

In the present embodiment, during the normal measurement, that is, when a FID signal is fetched from the NMR probe, the switches 207A and 207B responsive to the timing command sta and stb from the information processor are connected to terminals 207Aa and 207Ba, respectively, as shown in the figure. Namely, the transmission frequency up converter 202 is connected to the NMR probe 203 and the reception frequency down converter 204 is also connected to the NMR probe 203.

On the other hand, during a relaxation time of a sample, the switches 207A and 207B are connected to terminals 207Ab and 208Bb, respectively, in response to the timing commands sta and stb from the data processor 106. Namely, the switches 207A and 207B set up a detour in relation to the NMR probe 203. In this manner, phase correction value θ can be updated by taking advantage of the relaxation time of the sample as in the case of the first embodiment.

In the present embodiment, even phase errors attributable to transmission frequency up converter 202 and reception frequency down converter 204, for which embodiment 1 cannot fulfill complete correction, can be corrected. Especially, since the transmission frequency up converter functions inclusively of the function of power amplifier, a large error in phase due to power amplification can be suppressed to great advantage.

Generally, there is a level difference of about 60 dB between the radio wave and the receiving signal and therefore, when the transmission frequency up converter 202 is short-circuited to the reception frequency down converter 204 at the time that the phase correction is conducted, the output of transmission radio wave is desired to be weakened. Preferably, for weakening the output, an attenuator 220 of about 60 dB (indicated by a dotted line block in FIG. 4) is interposed between the switches 207A and 207B, that is, between the terminals 207Ab and 207Bb. This can prevent the receiver system from being damaged or erroneously operated.

By the second embodiment constructed as above, a NMR apparatus which exhibits high measurement accuracy by suppressing sufficiently a shift in phase taking place between the digital circuitry and the analog circuitry during measurement can be provided as in the case of the first embodiment.

Embodiment 3

Next, a NMR transceiver apparatus according to a third embodiment of the invention will be described.

Figure 5:
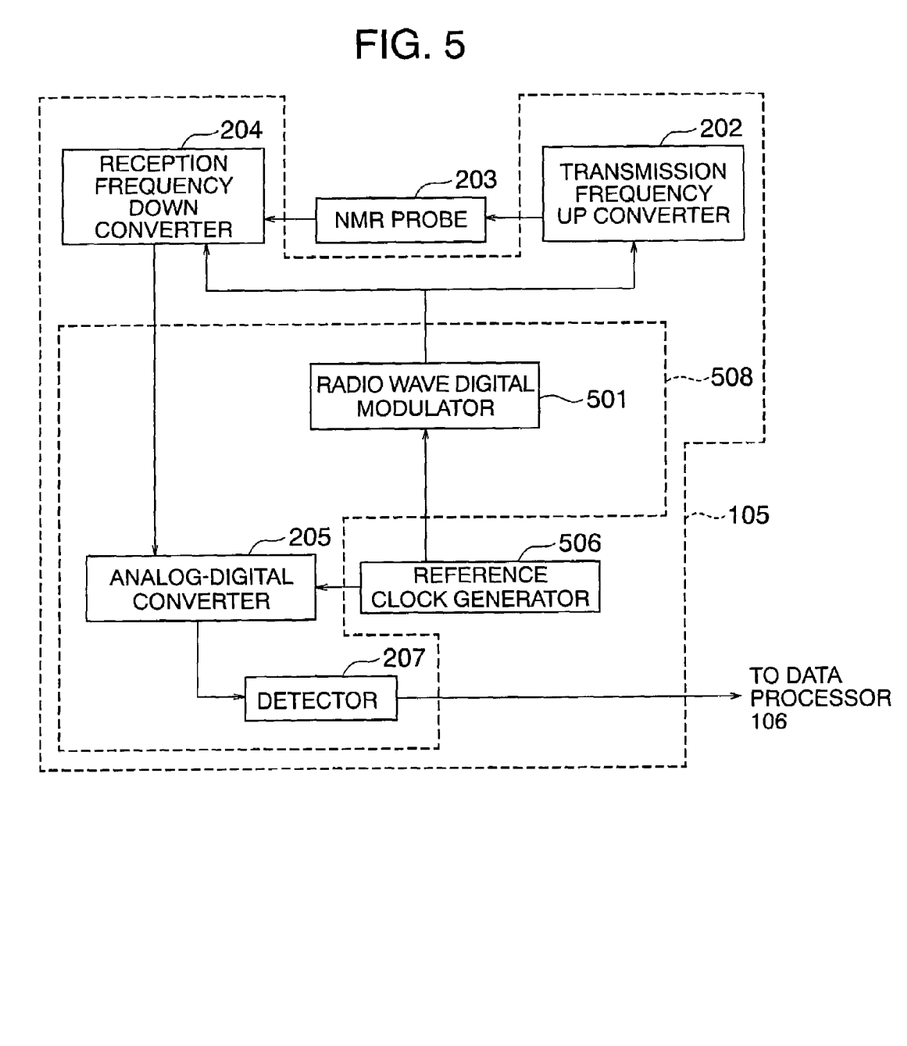
FIG. 5 is a block diagram showing the construction of a NMR transceiver circuit of a NMR apparatus according to a third embodiment of the invention.

A NMR transceiver circuit according to the third embodiment of the invention is illustrated in block form in FIG. 5. The NMR transceiver circuit 105 includes a radio wave digital modulator 501 and a transmission frequency up converter 202 for preparing, on the basis of a modulation wave prepared by the radio wave digital modulator 501, an electromagnetic wave to be transmitted to a sample. The electromagnetic wave is applied to a transmitter coil of NMR probe 203 to generate a FID signal which in turn is received by a receiver coil of NMR probe 203 and processed by a reception frequency down converter 204. Further, the analog FID signal is converted into a digital FID signal by means of an A/D converter 205, to which a reference clock (or reference signal) generator 506 is connected. Also connected to the A/D converter 205 is an IQ detector 207 having its output transmitted to the data processor 106.

In the present embodiment, the radio wave digital modulator 501, A/D converter 205 and IQ detector 207 constitute a digital processing unit 508. Clocks for the radio wave digital modulator 501 and A/D converter 205 are synchronized with each other on the basis of a clock generated from the reference clock generator 506. Through this, the frequency relation throughout the whole circuit can be made to be stable.

Figure 6:
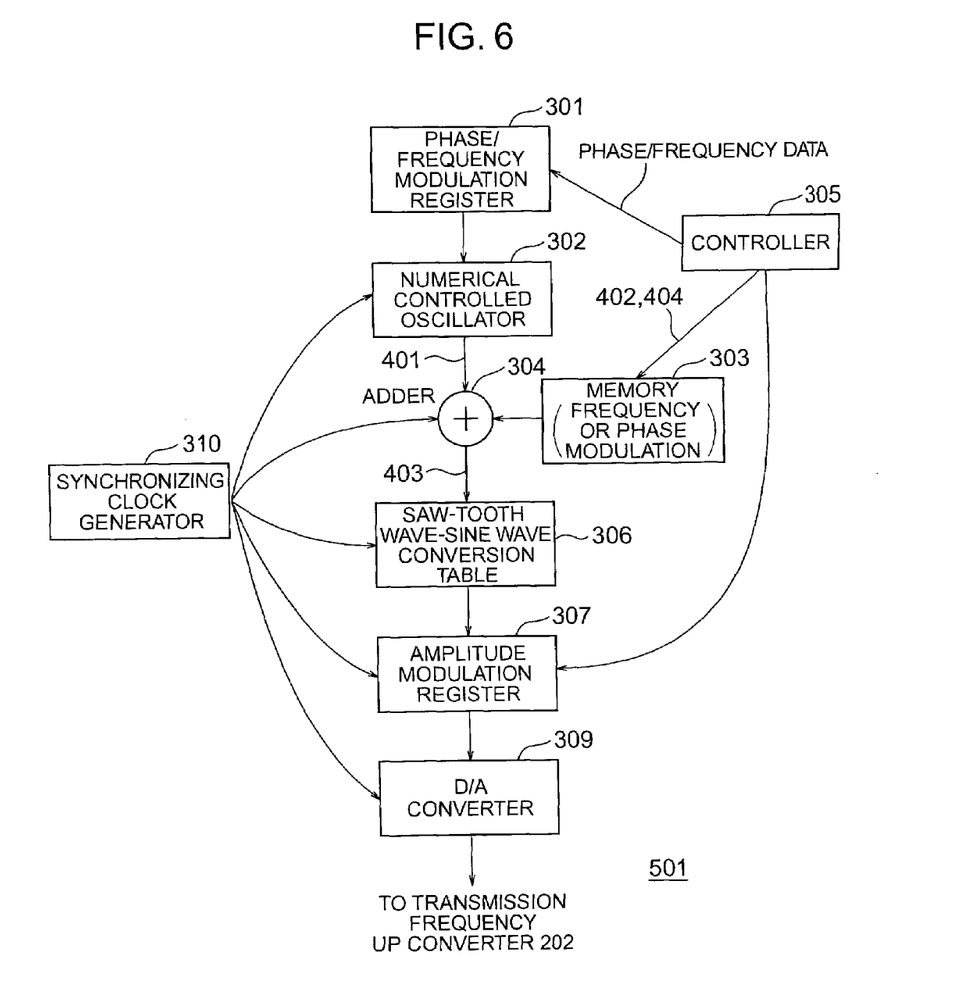
FIG. 6 is a block diagram showing an example of construction of an electromagnetic wave transmitter in the third embodiment.

An example of the electromagnetic wave transmitter in the present embodiment will be described by way of a radio wave digital modulator as illustrated in block diagram form in FIG. 6. The radio wave digital modulator 501 for generating a transmission modulation wave for NMR measurement is a principal component of the electromagnetic wave transmitter of the invention and is constructed as will be described below. More particularly, the transmitter includes a phase/frequency modulation numerical value register 301, a numerical controlled oscillator 302, a memory 303 for accumulating phase or frequency modulation data and an adder 304 for adding digital data from the numerical controlled oscillator 302 and modulation data from the memory 303. The electromagnetic wave transmitter further includes a saw-tooth wave—sine wave (phase-amplitude) converter (for example, a conversion table) 306 for converting an output of the adder 304 into a sine wave, an amplitude modulation numerical value register 307 for outputting the amplitude modulation data and a D/A converter 309 for converting digital data of the register 307 into an analog waveform. The modulation numerical value register 301, memory 303 and amplitude modulation numerical value register 307 are controlled by means of a controller 305.

It will be appreciated that the modulation numerical value register 301, numerical controlled oscillator 302, adder 304, conversion table 306 and amplitude modulation numerical value register 307 can be put together to constitute the previously-described direct digital converter (DDS). The conversion table 306 need not always be materialized with the table but may be a memory.

For example, a FPGA (field programmable gate array), a FIFO (first-in-first-out) memory or a RAM may be used as the memory 303.

It is to be noted herein that the numerical controlled oscillator 302, adder 304, saw-tooth wave—since wave (phase-amplitude) conversion table 306, amplitude modulation numerical value register 307 and D/A converter 309 are all operated in synchronism with the same synchronizing clock from a synchronizing clock generator 310. In other words, the same clock is used as the operating clock for numerical controlled oscillator, the addition operating clock for adder and the clock for reading data from the memory to the adder. Typically, this clock is of about 80 to 100 MHz. The synchronizing clock of the synchronizing clock generator 310 is generated synchronously with the clock from the reference clock generator 506.

An output from the D/A converter 309 is sent to the transmission frequency up converter 202 in FIG. 5. Typically, the output of the D/A converter 309 is 10 to 20 MHz. The output is converted in the transmission frequency up converter 202 into a higher radio wave frequency of, for example, 600 MHz corresponding to the NMR apparatus, especially, a magnetic field intensity of the magnet. In this manner, excitation can be done at the frequency suitable for the spin of a hydrogen nucleus in a measuring sample inserted in the NMR probe 203.

Generally, in the NMR measurement, a series of procedures of transmission of a radio wave pulse to the transmitter coil from the radio wave transceiver apparatus, radiation of the radio wave to a sample from the transmitter coil, reception of a FID signal from the sample and relaxation of the sample are carried out reiteratively. In the case of the sample being liquid, the time for pulse transmission is about 0.1 second, the time for reception of the FID signal is about 0.5 seconds and the time for relaxation of the sample is about 1 second and in a long NMR measuring operation, the above procedures are sometimes repeated for about a week.

In case the frequency used for excitation is, for example, 600 MHz, the FID signal from the sample has a spread frequency component of about ±10 kHz for that frequency. The FID signal is then converted into a lower frequency of about several MHz to 20 MHz in the reception frequency down converter 204. A frequency source used for the conversion is fed from the radio wave digital modulator 501 with a view to maintaining phase information of the receiving signal. The signal down converted to several MHz to 20 MHz in this manner is converted into a digital signal in the A/D converter 205.

Figure 7:
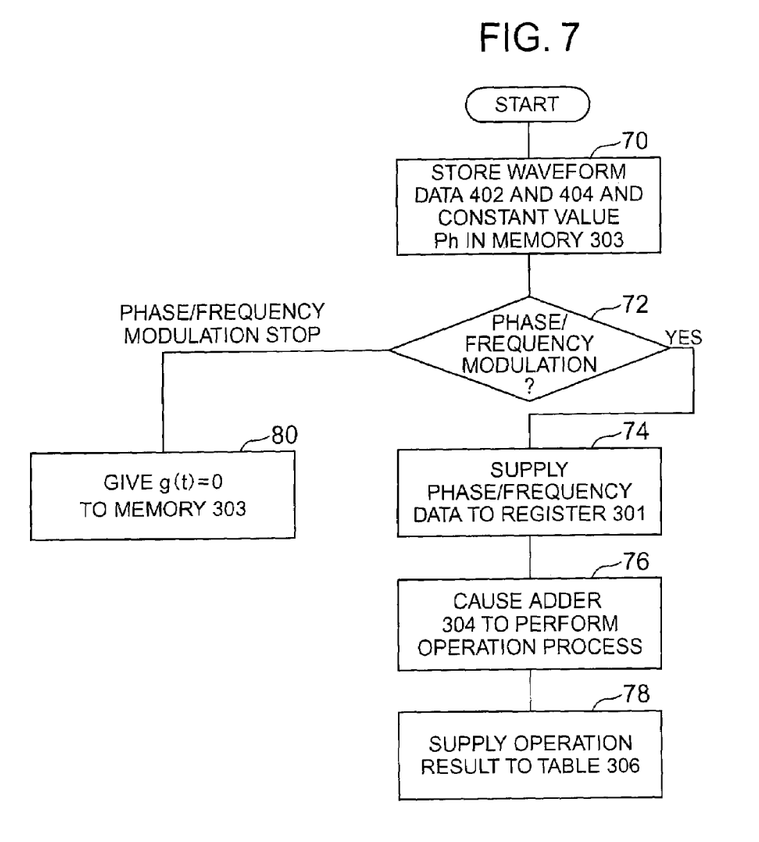
FIG. 7 is a flowchart for explaining operation of the electromagnetic wave transmitter in the third embodiment.

An electromagnetic wave transmitting method applicable to the NMR apparatus in the present embodiment, that is, a method of generating a transmission modulation wave for NMR measurement will now be described specifically with reference to a flowchart shown in FIG. 7. This operation is executed under the control of the controller 305.

Illustrated in FIGS. 8A to 8G are timecharts useful to explain output waveforms from the NMR transmitter circuit. The NMR transmitter circuit exemplifying the electromagnetic wave transmitter of the present invention corresponds to the radio wave digital modulator 501 in FIG. 5.

Firstly, at the beginning, the controller 305 supplies in advance phase or frequency modulation information, that is, waveform data for phase modulation (for example, waveform 402 in FIG. 8B) and waveform data for frequency modulation (for example, waveform 404 in FIG. 8D) to the memory 303 and stores them therein (step 70). Similarly, the controller 305 supplies in advance a setting value ph (ph1, ph2) of phase to the memory 303 and stores it therein. Subsequently, the controller 305 receives from a user a command as to which of phase modulation and frequency modulation is to be carried out (step 72) and in accordance with the command, the following process is conducted.

An instance where the phase modulation is carried out will first be described.

Figure 8A:
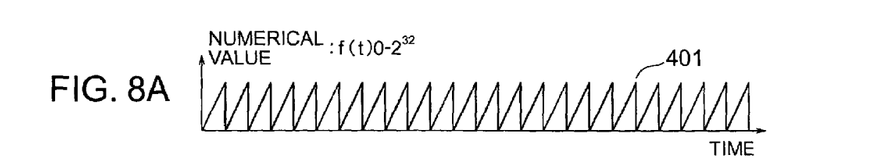
FIGS. 8A to 8E & 8G are waveform diagrams useful to explain outputs at essential parts in the electromagnetic wave transmitter in the third embodiment.

The controller 305 sends data of phase and frequency (digital numerical values) to the numerical controlled oscillator 302 via the phase/frequency modulation register 301 (step 74) and the numerical controlled oscillator 302 oscillates a saw-tooth wave 401 at a constant frequency and with a constant phase as shown in FIG. 8A. The saw-tooth wave 401 can be expressed by equation (3).

$$f(t)=Mod(a \times t+ph, 2^{32}) \quad (3)$$

where a represents frequency and ph represents a setting value of phase. A Mod function defines that a residue resulting from division of x by y is indicated by Mod (x, y). It will be appreciated that $2^{23}$ indicates that the numerical controlled oscillator 302 is an oscillator of 32 bits. Accordingly, if the numerical controlled oscillator 302 is an oscillator of 48 bits, $2^{48}$ applies.

For the purpose of changing the phase of output wave, data having a constant value unequal to zero over a period ranging from time t1 to time t2 (waveform 402 in FIG. 8B) is stored from the controller 305 to the memory 303. By changing the constant value, the phase to be modulated can also be changed.

Figure 8B:
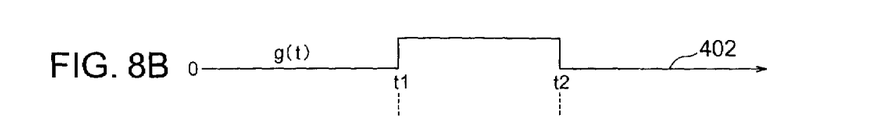

The data stored in the memory 303 is expressed by equations (4) to (6). This waveform 402 is represented by g(t) and is used when the saw-tooth wave 401 is modulated in phase. The g(t) is an arbitrary number in the range of from 0 to $2^{32}-1$.

$$g(t), 0 \leq g(t) \leq 2^{32}-1 \quad (4)$$

$$g(t)=0, 0<t<t1, t2<t \quad (5)$$

$$g(t)=ph1/360 \times 2^{32}, t1<t<t2 \quad (6)$$

where ph1 represents an angle by which the phase is to be changed. By changing the value of the constant numerical value in the waveform 402, the ph1 can be changed so that the phase may be controlled. The adder 304 reads the waveform 402 (g(t)) from the memory 303 and performs an integer-number operation pursuant to the following equation (7) on the basis of the g(t) and the saw-tooth wave 401 (f(t)) from the oscillator 302 (step 76).

$$Mod(g(t)+f(t), 2^{32}) \quad (7)$$

Figure 8C:
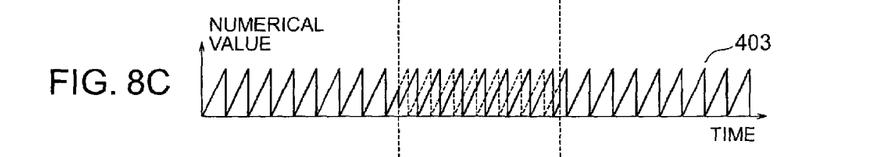

In other words, the adder 304 adds g(t) and f(t) and outputs a residue of division which is obtained by dividing the sum by $2^{32}$. Then, an output of adder 304 representing a result of addition of memory 303 and numerical controlled oscillator 302 takes the form of a saw-tooth wave 403 in which the phase changes from solid line to dotted line in the range of from t1 to t2 as shown in FIG. 8C. The output of the adder 304 is supplied to the conversion table 306 (step 78).

Figure 8D:
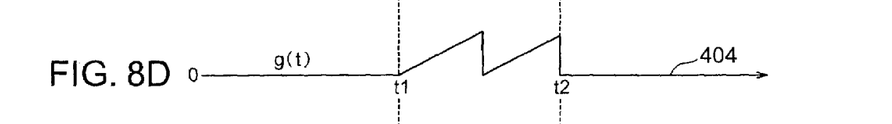

Similarly, when performing frequency modulation, the waveform 404 shown in FIG. 8D is used as g(t). The saw-tooth wave 404 which changes gradually with time in the range of from t1 to t2 is stored as data in the log memory 303. This g(t) is expressed by equations (8) and (9).

$$g(t)=0, \ 0<t<t1, \ t2<t \quad (8)$$

$$g(t)=Mod(b \times t+ph2, \ 2^{32}), \ t1<t<t2 \quad (9)$$

where b represents a modulation frequency and ph2 represents an offset phase at that time. The adder 304 performs an operation pursuant to equation (7) and an output frequency from the adder 304 amounts to a+b. By changing the value of b, the output frequency can also be changed.

Figure 8E:
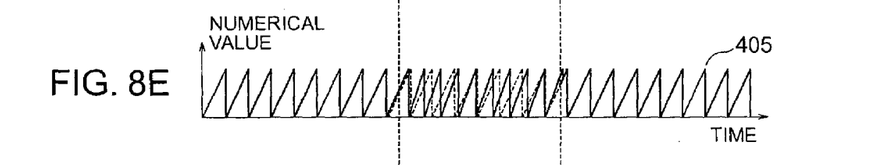

An operation pursuant to equation (7) is carried out using this g(t), with the result that the adder 304 delivers an output of saw-tooth wave 405 at a frequency slightly increased from dotted line to solid line in the range of from t1 to t2 as shown in FIG. 8E, which saw-tooth wave returns to the original saw-tooth wave at a time point t2, thus demonstrating that the thus obtained output is modulated in frequency.

The digital data from the adder is converted into an amplitude of sine waveform by means of the conversion table 30, the amplitude modulation data from the conversion table is delivered to the amplitude modulation register 307 and the digital data from the amplitude modulation register is converted into an analog waveform by means of the D/A converter 309. The thus generated electromagnetic wave is supplied to the transmission frequency up converter 202 so as to be converted to an electromagnetic wave at a higher frequency which in turn is supplied to the NMR probe.

When it is desired to give pause to the frequency modulation and phase modulation, the function of the adder 304 is stopped during the operation. Alternatively, at the time that a pause is desired to be given, g(t)=0 is fed from the controller 305 to the memory 303. Subsequently, as modulation data of the log memory 303, zero (g(t)=0) substituting for the aforementioned wave data g(t) (equation (4) to equation (6) or equations (8) and (9)) is delivered to the adder 304, causing the adder 304 to perform addition pursuant to equation (7) (step 80). Through this, the frequency modulation and phase modulation routing through the memory 303 can be stopped during operation.

Figure 8G:
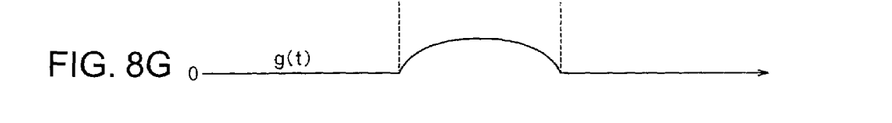

The aforementioned waveform data g(t) represented by waveform 402 or 404 is a mere example and it may take an arc-shaped waveform as shown in FIG. 8G to ensure that both the phase and the frequency can be changed continuously.

If in the above embodiment a FIFO memory is used as the memory 303, the adder 304 responds to a synchronizing clock from the synchronizing clock generator 310 to perform addition by sequentially reading data from the FIFO memory.

In each of the foregoing embodiments, the transmission frequency converter 202 has been described as being a frequency up converter but this is not limitative and it may be a down converter. Similarly, the reception frequency converter 204 has been described as being a frequency down converter but this is not limitative and it may be an up converter.

As described in the foregoing, in the present embodiment, data stored in the memory 303 is changed variously. Through this, as compared to the conventional technique in which a plurality of numerical controlled oscillators 302 are switched or the phase and frequency of the numerical controlled oscillator are switched many times, more continuous and precise modulation can be done at high speeds.

As will be seen from the foregoing, the radio wave digital modulator 501 in the present embodiment has the DDS as the principal component. Accordingly, by using the present radio wave digital modulator in the NMR apparatus, the phase and frequency can be switched many times without using two DDS's the conventional technique adopts.

The superconducting magnet unit in the NMR apparatus according to the present embodiment is comprised of a superconducting magnet having the winding axis in the horizontal direction but as far as the electromagnetic wave transceiver apparatus according to the present embodiment is used, the magnet can also be applicable to another type of NMR apparatus.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A NMR apparatus having a magnetic unit for generating a static magnetic field, a NMR probe having a transmitter coil for radiating an electromagnetic wave to a sample inserted in the magnetic unit and a receiver coil for detecting a signal generated from the sample and an electromagnetic wave transceiver apparatus electrically connectable to either the transmitter coil or receiver coil in the NMR probe, said electromagnetic wave transceiver apparatus comprising:

an intermediate frequency generator for preparing an intermediate wave;

a transmission frequency converter for preparing, on the basis of an intermediate frequency of the intermediate wave, an electromagnetic wave to be radiated from said transmitter coil;

a reception frequency converter for processing a signal received by said NMR probe;

an analog-digital converter for converting an output of said reception frequency converter into a digital signal;

an IQ (in-phase & quadrature-phase) detector for performing detection on the basis of an output of said analog-digital converter and delivering a detection signal;

a phase locked loop for synchronizing a clock frequency for said analog-digital converter with the frequency from said intermediate frequency generator; and a switch interposed between said analog-digital converter and said reception frequency converter to select either an input from said intermediate frequency generator or an input from said reception frequency converter.

2. A NMR apparatus according to claim 1, wherein said electromagnetic wave transceiver apparatus further comprises:

a phase/amplitude calculator for receiving the detection signal from said IQ detector to determine a phase correction value; and an IQ phase corrector for storing the phase correction value from said phase/amplitude calculator, said IQ phase corrector being operative to correct the detection signal from said IQ detector with said phase correction value and output the corrected detection signal as a detection signal from said electromagnetic wave transceiver apparatus.

3. A NMR apparatus according to claim 2, wherein in a relaxation time, said switch connects an output of said intermediate frequency generator to the input of said analog-digital converter in place of an output of said reception frequency converter and in the relaxation time, said phase/ amplitude calculator determines said phase correction value to store it in said IQ phase corrector.

4. A NMR apparatus according to claim 3, wherein during measurement exclusive of the relaxation time, said switch connects an output of said reception frequency converter to the input of said analog-digital converter in place of an output of said intermediate frequency generator, and during the measurement exclusive of the relaxation time, said IQ phase corrector corrects the detection signal form said IQ detector with the phase correction value and the thus corrected detection signal is delivered as a detection signal from said electromagnetic wave transceiver apparatus.

5. A transceiver apparatus for a NMR apparatus, comprising:
an intermediate frequency generator for preparing an intermediate wave;
a transmission frequency converter for preparing, on the basis of an intermediate frequency of the intermediate wave, an electromagnetic wave to be radiated to a sample from a transmitter coil;
a reception frequency converter for processing a signal received by a NMR probe;
an analog-digital converter for converting an output of said reception frequency converter into a digital signal;
an IQ (in-phase & quadrature-phase) detector for performing, on the basis of the output of said analog-digital converter, detection to deliver a detection signal;
a phase locked loop for synchronizing a clock frequency for said analog-digital converter with the frequency from said intermediate frequency generator; and
a switch interposed between said analog-digital converter and said reception frequency converter to select either an input from said intermediate frequency generator or an input from said reception frequency converter.

6. A transceiver apparatus for NMR apparatus according to claim 5, wherein said electromagnetic wave transceiver apparatus further comprises:
a phase/amplitude calculator for receiving the detection signal from said IQ detector to determine a phase correction value; and
an IQ phase corrector for storing the phase correction value from said phase/amplitude calculator,
said IQ phase corrector being operative to correct the detection signal from said IQ detector with the phase correction value and deliver the thus corrected detection signal as a detection signal from said electromagnetic wave transceiver apparatus.

7. A NMR apparatus having a magnetic unit for generating a static magnetic field, a NMR probe having a transmitter coil for radiating an electromagnetic wave to a sample inserted in the magnet unit and a receiver coil for detecting a signal generated from the sample, and an electromagnetic wave transceiver apparatus electrically connectable to either the transmitter coil or the receiver coil in the NMR probe,
said electromagnetic wave transceiver apparatus comprising:
an intermediate frequency generator for preparing an intermediate wave;
a transmission frequency converter for preparing, on the basis of an intermediate frequency of the intermediate wave, an electromagnetic wave to be radiated from said transmitter coil;
a reception frequency converter for processing a signal received by said NMR probe;
an analog-digital converter for converting an output of said reception frequency converter;
an IQ (in-phase & quadrature-phase) detector for performing detection on the basis of an output of said analog-digital converter to output a detection signal;
a phase locked loop for synchronizing a clock frequency for said analog-digital converter with the frequency from said intermediate frequency generator;
a first switch interposed between said transmission frequency converter and said transmitter coil in said NMR probe;
a second switch interposed between said receiver coil in said NMR probe and said reception frequency converter; and
a wiring line for directly connecting said first and second switches, wherein
said first switch delivers an output from said transmission frequency converter to either said transmitter coil or said wiring line and said second switch switches an input from said receiver coil and an input from said wiring line to deliver either input to said reception frequency converter.

8. A NMR apparatus according to claim 7, wherein said electromagnetic wave transceiver apparatus further comprises:
a phase/amplitude calculator for inputting the detection signal from said IQ detector to determine a phase correction value; and
an IQ phase corrector for storing the phase correction value from said phase/amplitude calculator,
said IQ phase corrector being operative to correct the detection signal from said IQ detector with the phase correction value and to output the thus corrected detection signal as a detection signal from said electromagnetic wave transceiver apparatus.

9. A NMR apparatus according to claim 8, wherein in a relaxation time, said first switch delivers the output of said reception frequency converter to said wiring line instead of said transmitter coil and in the relaxation time, said second switch delivers the input from said wiring line to said reception frequency converter in place of the input from said receiver coil.

10. A NMR apparatus according to claim 7, wherein said electromagnetic wave transceiver apparatus further comprises an attenuator interposed between said first and second switches.

* * * * *